United States Patent [19]

Geiser

[11] Patent Number: 4,881,717
[45] Date of Patent: Nov. 21, 1989

[54] VACUUM CHAMBER

[75] Inventor: Friedrich Geiser, Nüziders, Austria

[73] Assignee: Siegried Schertler, Haag, Switzerland

[21] Appl. No.: 300,477

[22] Filed: Jan. 23, 1989

[30] Foreign Application Priority Data

Jan. 23, 1988 [DE] Fed. Rep. of Germany ....... 3801998

[51] Int. Cl.$^4$ .............................................. F16K 51/00
[52] U.S. Cl. .................................... 251/144; 251/356; 251/327
[58] Field of Search ................ 251/144, 356, 62, 326, 251/327, 333; 118/719

[56] References Cited

U.S. PATENT DOCUMENTS

| 587,439 | 8/1897 | Jenkins | 251/327 |
| 594,634 | 11/1987 | Lunken | 251/327 |
| 1,613,509 | 1/1927 | Gill | 251/327 |
| 2,797,063 | 6/1957 | Hobbs | 251/327 |

Primary Examiner—A. Michael Chambers
Attorney, Agent, or Firm—Toren, McGeady & Associates

[57] ABSTRACT

A chamber for use in vacuum plants, particularly for treating or storing workpieces or other objects and/or for passing workpieces or other objects therethrough. At least one wall of the chamber has at least one opening through which the workpieces or objects can be introduced or removed. The opening can be closed by means of a closing member including a sealing member which acts together with a sealing surface. The sealing surface is arranged within the chamber laterally of the opening. A circumferentially closed sealing member arranged on the closing member rests against the sealing surface in the closed position of the closing member. The sealing surface has imaginary straight generatrices which extend parallel to the axis of the opening of the chamber. The sealing surface has at least two sealing surface portion which are laterally offset from each other relative to the axis of the opening and which are connected to each other at opposite locations. The sealing member has sections of different lengths and/or shapes which are located in different planes. Two principal sections of the sealing member are located in planes which extend perpendicularly to the axis of the opening. The two principal sections are spaced apart from each other and are connected by lateral sections. The closing member has a surface which carries the sealing member and corresponds in shape to the sealing surface. The closing member is slidable in the wall of the plane and parallel to the plane of the opening.

9 Claims, 3 Drawing Sheets

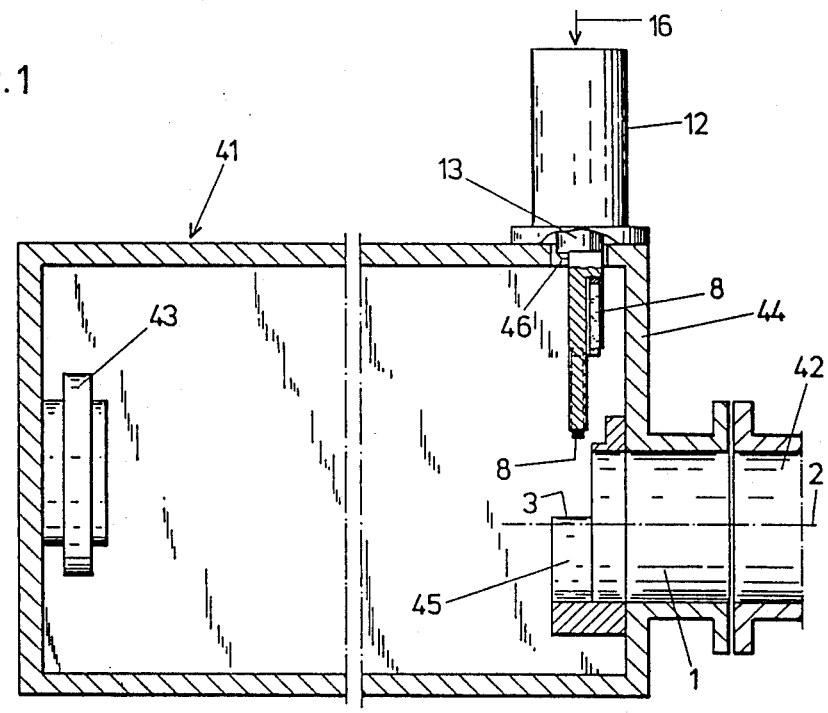
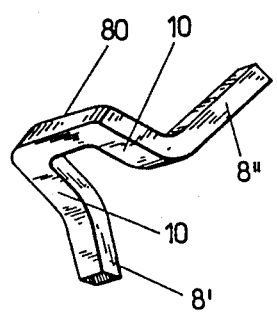
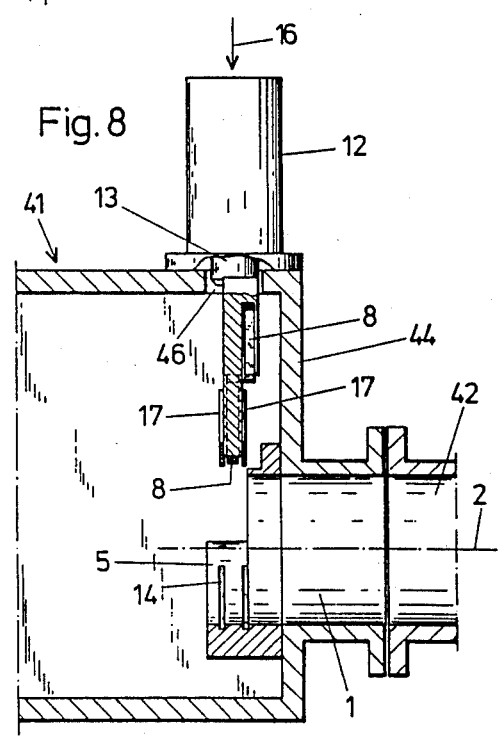

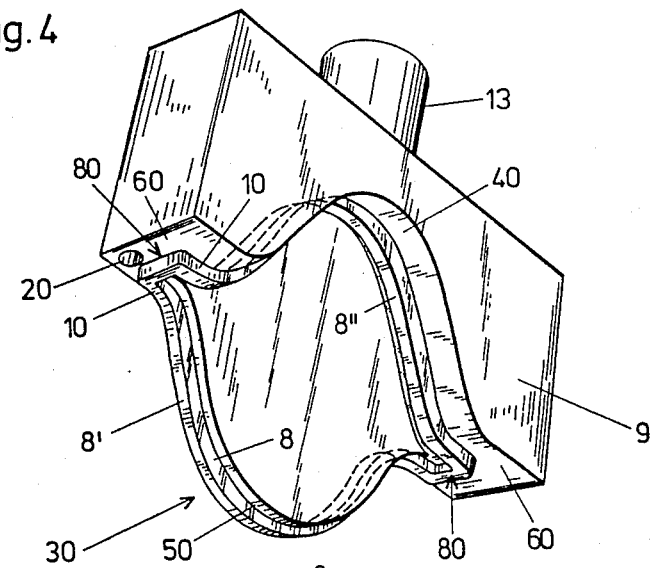
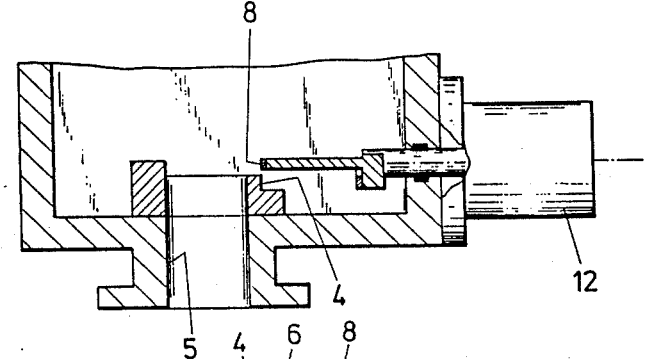
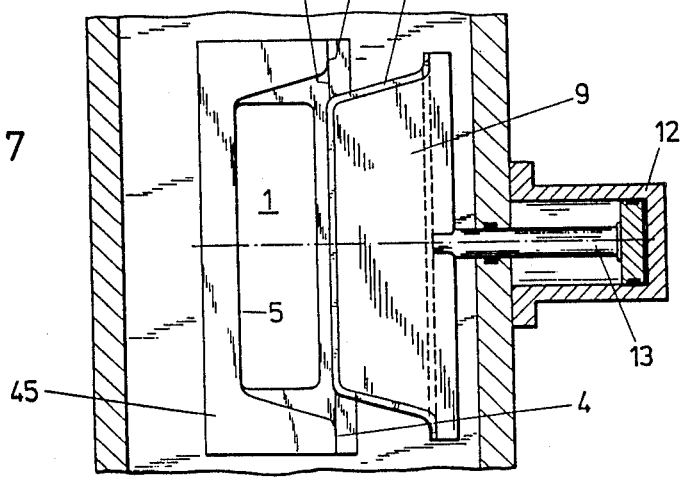

VACUUM CHAMBER

BACKGROUND OF THE INVENTION

1. Field of the Invention

The present invention relates to a chamber, particularly for use in vacuum plants, for treating or storing workpieces or other objects and/or for passing workpieces or other objects therethrough. At least one wall of this vacuum-tight chamber has at least one opening through which the workpieces or objects can be introduced or removed from the chamber. The opening can be closed by means of a closing member including a sealing member which acts together with a sealing surface. The sealing surface is arranged within the chamber and laterally of the opening. A circumferentially closed sealing member arranged on the closing member rests against the sealing surface in the closed position of the closing member.

2. Description of the Related Art

In many technical manufacturing processes and process steps, the vacuum plays an important and decisive role. During the manufacture of workpieces and other objects, these workpieces an objects are introduced into the vacuum and treated in the vacuum. The manufacture of semiconductors shall only be mentioned as an example. For the working and treatment of these objects or workpieces, chambers are provided within the vacuum plant or high vacuum plant which chambers can be evacuated and into which the objects can be introduced and from which the objects can be removed through closable gates and openings.

For evacuating these chambers, the chambers are connected to pumps through lines. It must be possible to separate the pumps from the chambers. Also, a plurality of such chambers can be arranged in series or parallel to each other, wherein the chambers arranged in series must be separable from each other through gates.

In the past, the requirement that the chambers must be separable was met by connecting the chambers by means of pipelines and arranging valves or slides in these pipelines. The individual structural components were connected to each other by means of flanges. Instead of the flange-type connections, the structural components could also be connected to each other by means of welding seams.

Groups of such structural components not only required a large amount of space, but they also are very expensive. They are expensive particularly because such connections within high vacuum plants and vacuum plants had to meet extremely high requirements with respect to tightness and because it was necessary to ensure that structural components of metal did not slide on each other under high pressure in the vacuum since no lubricants may be present in the vacuum. As a result, the structures were complicated and expensive and required a large amount of space.

An arrangement of the type described above is explained and illustrated in U.S. Pat. No. 3,568,632. The patent essentially describes the vacuum chambers which can be separated from each other by means of slide-like closing members. The vacuum chambers are mounted immediately adjacent each other and are used for the vapor deposition of optical lenses or for preparing the lenses for vapor deposition. The slide-like closing members used in the patent cooperate with sealing surfaces. Circumferentially closed sealing members are provided, however, the construction and arrangement of the sealing members is not described in detail. Accordingly, U.S. Pat. No. 3,568,632 does not suggest a solution for solving the sealing problem.

Slide-type closing members with sealing members have also been described in conjunction with other containers in U.S. Pat. Nos. 4,003,714, 3,142,410 and 2,227,712. The sealing members described in these patents do not have to meet the high requirements with respect to tightness as is the case in vacuum plants. Therefore, it was not necessary in these sealing members to provide special measures for reducing the load acting on the sealing member or for protecting the sealing surfaces themselves because such measures were not necessary in these types of constructions. In all these known slide-type closing members, the actuation of the closing members results in transverse and shearing forces acting on the sealing members. Moreover, the known closing members are constructed in such a way that the structural elements which generate the sealing forces slide on each other under substantial pressure.

It is, therefore, the primary object of the present invention to provide chambers of the above-described type which are inexpensive to construct and which make it nevertheless possible to separate the chambers safely and reliably and permanently from each other or from the pipelines or connected units.

Specifically, it is an object of the present invention to provide a chamber in which all those operations are carried out within the chamber which in the past had to be carried out by means of complicated valves or slides outside of the chamber. In addition, the structural elements or element groups for carrying out these operations are to perform only simple linear movements. Also, the closing member is to be of simple construction. The closing member is to have as few components as possible which are movable relative to each other, so that the closing member can also be used in quick-closing and emergency valves where high accelerations occur.

SUMMARY OF THE INVENTION

In accordance with the present invention, the sealing surface has imaginary straight generatrices which extend parallel to the axis of the opening of the chamber. The sealing surface has at least two sealing surface portions which are laterally offset from each other relative to the axis of the opening and which are connected to each other at opposite locations. The circumferentially closed sealing member which is formed of one piece has sections of different lengths and/or shapes which are located in different planes. Two principal sections of the sealing member are located in planes which extend perpendicularly to the axis of the opening. The two principal sections are spaced apart from each other and are connected by lateral sections. The closing member has a surface which carries the circumferentially closed sealing member and corresponds in its shape to the sealing surface. The closing member is slidable in the wall of the chamber in its plane and parallel to the plane of the opening.

The various features of novelty which characterize the invention are pointed out with particularity in the claims annexed to and forming a part of this disclosure. For a better understanding of the invention, its operating advantages attained by its use, reference should be had to the drawings, and descriptive matter in which there are illustrated and described preferred embodiments of the invention.

BRIEF DESCRIPTION OF THE DRAWING

In the drawing:

FIG. 1 is a longitudinal sectional view of a chamber according to the present invention for use in a high vacuum plant;

FIG. 4 is also a perspective view of the closing member, however, seen in the direction of arrow A of FIG. 3;

FIG. 5 is a perspective view of a portion of the circumferential sealing member;

FIG. 6 is a partial transverse sectional view of a chamber according to another embodiment of the present invention;

FIG. 7 is a longitudinal sectional view of the chamber of FIG. 7; and

FIG. 8 is a longitudinal sectional view, as in FIG. 1, of another embodiment of the present invention.

DESCRIPTION OF THE PREFERRED EMBODIMENTS

Figure 2:
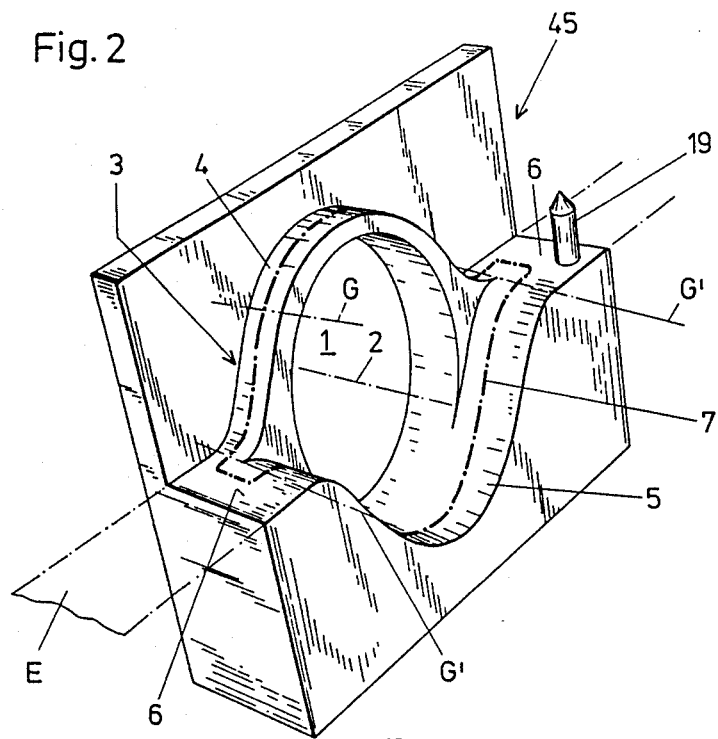
FIG. 2 is a perspective view of the structural component including sealing surfaces to be mounted in the chamber.

FIG. 1 of the drawing is a longitudinal sectional view of a chamber 41 which is connected through a pipe connection 42 to a vacuum plant, not shown or described in detail. An insert 43 is used for the treatment of a workpiece which can be introduced into the chamber 41 through an opening 1 in a side wall 44 of the chamber 41. A structural component 45 which includes a sealing surface 3 is arranged on the side wall 44 in the area of the chamber 41 laterally of the opening 1. The structural component 45 is fixedly connected to the side wall 44, for example, by means of screws or welding. A closing member 9 carrying a sealing member 8 is linearly movably mounted perpendicularly of the axis 2 of the opening 1. The closing member 9 can be actuated by means of a piston rod 13 and a piston-cylinder unit 12. The piston rod 13 extends through an opening 46 provided in the chamber 41. The piston-cylinder unit 12 is tightly surrounded by a housing 47 which is flanged onto the upper wall of the housing 41 with a sealing member, not shown, placed between the housing 47 and the upper wall of the housing 41.

FIG. 2 of the drawing shows the structural component 45 on a larger scale as compared to FIG. 1. Structural component 45 is fastened to chamber 41 on side wall 44.

The opening 1 has an axis 2 illustrated in a dash-dot line. The opening 1 is surrounded by a sealing surface 3 which has different portions 4, 5 and 6 having different shapes. The portions 4 and 5 are formed by cylindrical surfaces, while the portions 6 are formed by plane surfaces. The cylindrically-shaped portions 4 and 5 and the plane portions 6 lead into each other through continuously extending curvatures. The two lateral, plane, outwardly extending portions 6 of sealing surface 3 are located in a common plane E which is indicated by a thin dash-dot line in FIG. 2. Independently of the different shapes of portions 4, 5 and 6 of the sealing surface 3, these portions have in common that the imaginary generatrix of each portion is straight and extends parallel to the axis 2 of the opening. The generatrices are illustrated in FIG. 2 at G and G'. Dash-dot line 7 which is indicated in FIG. 2 on sealing surface 3 is the line where the sealing member 8 rests against the sealing surface 3 when the closing member is moved in. As can also be seen in FIG. 2, portions 4 and 5 of sealing surface 3 are located one behind the other seen in the direction of the axis 2 of the opening 1 or laterally next to each other relative to axis 2.

Figure 3:
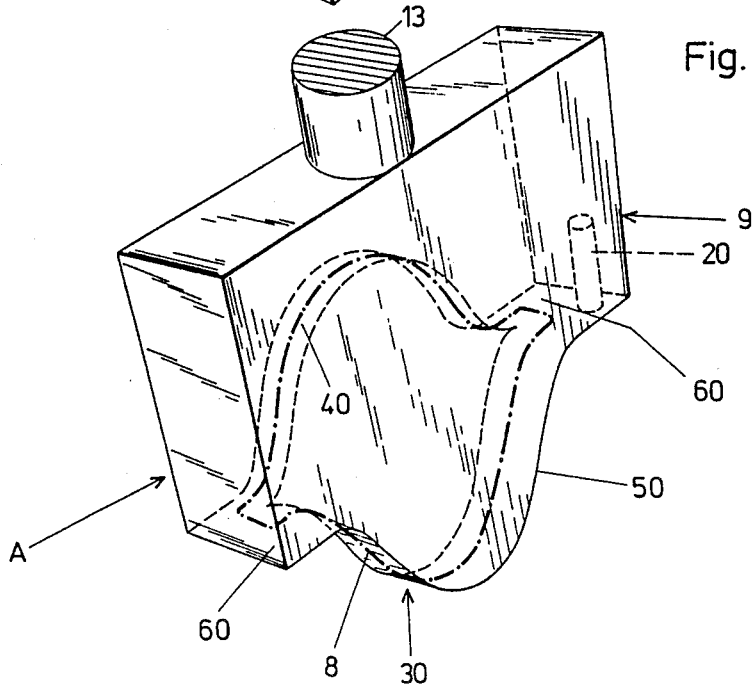
FIG. 3 is a perspective view of the corresponding closing member.

FIG. 3 of the drawing shows a closing member 9 which is illustrated in a position corresponding to that of the structural component shown in FIG. 2. In FIG. 4, the closing member 9 is illustrated from the opposite side. In its area which participates in the sealing action, the closing member 9 has a surface 30 which is shaped to correspond to the sealing surface 3 in the structural component 45. Surface 30 carries and supports the circumferentially closed sealing member 8. For example, the sealing member 8 may be vulcanized onto surface 30. The portions 40, 50 and 60 of surface 30 which support sealing member 8 and the above-mentioned portions 4, 5 and 6 of the sealing surface 3, which are located immediately next to each other when the closing member 9 is moved in, have been provided with the same reference numerals with the exception of an 0 having been added to distinguish between the portions. The closing member is fastened to piston rod 13.

As can be seen from the above-discussed figures of the drawing, the circumferentially closed, single-piece sealing member 8 has sections of different shape which are located in different planes relative to the plane of the opening 1. Two principal sections 8' and 8" of the circumferentially closed sealing member 8 are located in planes which extend perpendicularly relative to axis 2 of opening 1. In the direction of axis 2, the two principal sections 8', 8" are located offset relative to each other. The two principal sections 8' and 8" of sealing member 8 are connected to each other through lateral sections 80 which are U-shaped and whose sides 10 are located in planes 60.

The portions 4 and 5 of the sealing surface 3 for contacting the principal portions 8' and 8" of sealing member 8 are located one behind the other seen in axial direction 2 of the opening 1. In the areas in which the 4 and 5 have a common, straight and axially parallel generatrix D', the portions 4 and 5 lead into lateral, outwardly extending, plane portions 6 which, in turn, are arranged in a common plane E which extends parallel to axis 2 of opening 1.

FIG. 8 shows a vacuum chamber 41 similar to the vacuum chamber shown in FIG. 1, however, the following changes have been made in the vacuum chamber 41 according to FIG. 8.

As an be seen in FIG. 8, the closing member 9 has at its lower edge 18 on both sides of the sealing member 8 a protective rim 17 each which is laterally slightly spaced from the sealing member 8 seen in axial direction and which protrudes beyond sealing member 8 in sliding direction of the closing member 9 as indicated by arrow 16. The portion 5 of the sealing surface 3 has groove-like indentations 14 and 15 which receive the two protective rims 17 of the closing member when the closing member 9 is moved in.

The closing member 9 is directly connected to the piston rod 13 of a piston-cylinder unit 12. The piston-cylinder unit 12 is a quick-acting unit, so that extremely high closing speeds can be obtained and the above-described arrangement can be used as a quick-closing or emergency slide.

As is apparent from the foregoing, the closing member 9 is manufactured in a single piece. In other words, closing member 9 does not have any parts which are movable relative to each other and, therefore, closing member 9 can be subjected to extremely high acceleration forces. The protective rims 17 protect the sealing member 8 from any flow which may pass through the opening 1. Accordingly, the closing member 9 can be moved, for example, into an energy-rich electron beam without the sealing member 8 itself being hit by this energy-rich beam and being damaged or at least impaired in its service life.

In the embodiments discussed above, the openings 1 have a circular shape. FIGS. 6 and 7, on the othe hand, show a sluice-type slide in transverse and longitudinal sectional views with an opening 1 having a rectangular shape. The sections 4, 5 and 6 of the sealing surface of the structural component 45 are identified accordingly in FIG. 7. As is further to be seen from FIG. 7, the two principal sections 8' and 8" of the circumferentially closed sealing member 8 have over the length thereof a different shape. Principal section 8' is straight while the other principal section 8" is curved.

In all embodiments described above, sealing member 8 is mounted on closing member 9. Without leaving the scope of the invention, it would be possible to reverse this arrangement. In other words, the sealing member 8 could be mounted stationary on the structural component 45 and the cooperating sealing surfaces could be provided on the closing member 9.

If high differential pressures occur when the closing member 9 is in the closed position, it is possible to guide the edges of the closing member 9. For this purpose, appropriate guide rails could be provided within the chamber 41 or it would be possible to provide guide grooves on the inner sides of the walls of the chamber 41 in which the edges of the closing member 9 either slide directly or roll on rolling bodies which are freely rotatably mounted on the edge of the closing member 9 and extend into the guide grooves. However, for clarity's sake, such guide means at the edges were not shown in the drawing.

Instead of a support of the closing member 9 at the edge thereof, the closing member 9 can also be secured in some other manner against the pressure. For example, upwardly projecting pins can be arranged on the surfaces 6, as shown in FIG. 2. In FIG. 2, a pin 19 is shown in dash-dot lines. When the closing member 9 is moved in, the pin 19 is received by a corresponding bore 20 which starts at planes 60 of closing members 9, as can be seen in FIGS. 3 and 4.

In the sealing surface 3 shown in FIG. 2 as well as in the sealing surface shown in FIGS. 6 and 7, the portions 4 and 5 lead into each other through lateral portions 6. This is also true for the corresponding portions 40, 50 and 60 which carry the sealing member 8. Accordingly, the sealing member must have the shape shown in FIG. 5. However, it is also possible to omit the plane portions 6 and the corresponding portions 60 if the requirements to be made of the sealing action are not too high. In that case, the sealing surface 3 shown in FIG. 2 would be bordered by the imaginary generatrix G'. Also, in that case, the sides 10 of the sealing member 8 shown in FIG. 5 would be omitted, so that the lateral section 80 would directly continue in the principal sections 8' and 8" of sealing member 8.

In the practical embodiments of the present invention, the piston rod 13 of the piston-cylinder unit 12 is advantageously sealed by means of metal bellows as is conventional in closing members in vacuum plants. The metal bellows through which the piston rod 13 extends may extend into the interior of the chamber 41. The metal bellows is advantageously welded at one end to the piston rod 13 and is tightly clamped at its other end to the end surface of the piston-cylinder unit 12.

The present invention provides a chamber with a closing means which includes a closing member, a sealing member and sealing surfaces. However, compared to conventional arrangements of this type, a housing in the sense of a slide housing or valve housing is entirely unnecessary.

Closing members according to the present invention are used in vacuum chambers, in locks, in front of viewing windows or the like. The opening 1 may have any selected shape. Thus, the opening 1 may be round or it may have corners. Instead of a piston-cylinder unit as the actuating means for the closing member, it is also possible to use manually operated, electromagnetic, pneumatic or hydraulic actuating means or actuating means with electric motors.

While specific embodiments of the invention have been shown and described in detail to illustrate the application of the inventive principles, it will be understood that the invention may be embodied otherwise without departing from such principles.

I claim:

1. In a vacuum-tight chamber for use in vacuum plants, the chamber serving for treating or storing objects therein or for passing objects therethrough, the chamber being formed by walls, at least one of the walls having at least one opening for placing the objects in the chamber and removing the objects therefrom, the opening having an axis and a plane extending perpendicularly to the axis, a closing member for closing the opening, a sealing surface being provided within the chamber and laterally spaced from the opening, a circumferentially closed sealing member being arranged on the closing member, the sealing member resting against the sealing surface in the closed position of the closing member, the improvement comprising the sealing surface having imaginary straight generatrices which extend parallel to the axis of the opening of the chamber, the sealing surface having at least two sealing surface portions, the sealing surface portions being laterally offset from each other relative to the axis of the opening and leading into each other at opposite locations, the circumferentially closed sealing member being formed of one piece, the sealing member having sections including two principal sections of different lengths or shapes which are located in different planes, the two principal sections of the sealing member being located in planes which extend perpendicularly to the axis of the opening, the two principal sections being spaced apart from each other and being connected by lateral sections, the closing member having a surface carrying the circumferentially closed sealing member and corresponding in shape to the sealing surface, the closing member extending in a plane, the closing member being slidable in the wall of the chamber in the plane of the closing member and parallel to the plane of the opening.

2. The chamber according to claim 1, comprising a structural component inserted in the chamber and tightly welded to the chamber wall, the sealing surface being part of the structural component.

3. The chamber according to claim 1, wherein the closing member is a plane plate and the circumferentially closed sealing member is mounted on end faces of step-like portions of the closing member.

4. The chamber according to claim 1, wherein the two principal sections of the circumferentially closed sealing member are differently shaped over the length thereof.

5. The chamber according to claim 4, wherein one of the two principal sections is straight and the other principal section is curved.

6. The chamber according to claim 1, wherein the closing member has at a lower side thereof and on at least one side of the sealing member a protective rim which projects relative to the sealing member in closing direction of the closing member, and a groove-like recess is provided in the sealing surface for receiving the protective rim when the closing member is in the closed position.

7. The chamber according to claim 1, wherein the lateral sections are U-shaped and have sides, the sides of the U-shaped lateral sections being located in a plane, the sealing surface having portions which are located one behind the other in axial direction of the opening, the sealing surface portions being contacted by the principal sections of the sealing member when the sealing member is in the closed position, the sealing surface portions having an area in which they have a common straight generatrix which extends parallel to the axis, laterally outwardly extending plane sealing surface portions being connected in the area of the sealing surface portions which are located one behind the other, the plane sealing surface portions being located in planes which extend parallel to each other and parallel to the axis of the opening.

8. The chamber according to claim 7, wherein the plane sealing surface portions are located in a common plane.

9. The chamber according to claim 7, wherein the sealing surface portions which are located one behind the other are essentially cylindrically-shaped and are connected to the plane sealing surface portions through continuously curved portions.

* * * * *